2,548,537

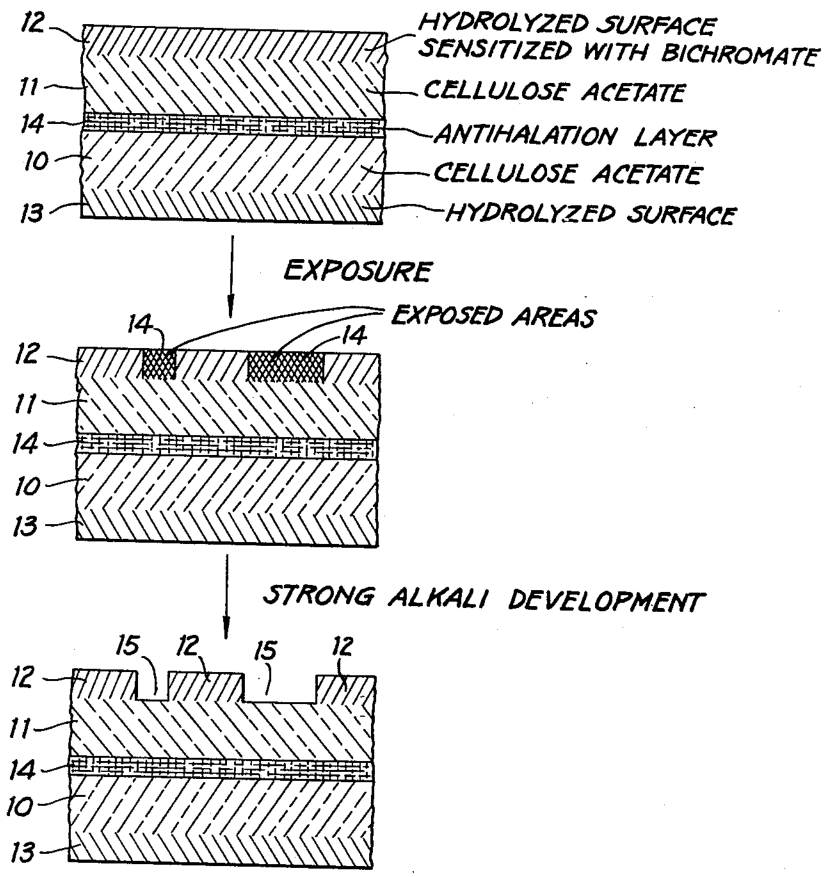
WILLIAM O. KENYON
CORNELIUS C. UNRUH
INVENTORS
BY Daniel I. Mayne
W. H. McDowell
ATTORNEY & AGENT Patented Apr. 10, 1951

UNITED STATES PATENT OFFICE 2,548,537

METHOD OF MAKING CELLULOSE ESTER LITHOGRAPHIC PRINTING PLATES

William O. Kenyon and Cornelius C. Unruh, Rochester, N. Y., assignors to Eastman Kodak Company, Rochester, N. Y., a corporation of New Jersey Application February 9, 1949, Serial No. 75,453

10 Claims. (Cl. 95—5.4)

This invention relates to the preparation of lithographic printing plates.

Printing plates of the lithographic type are well known, having previously been prepared, for example from metal plates carrying sensitive colloid layers and from cellulose ester plates carrying a sensitive stratum or layer. The Colt U. S. Patent 2,448,861 granted September 7, 1948, describes a method for the preparation of cellulose ester printing plates according to which a hydrolyzed surface layer of a cellulose ester sheet is sensitized with bichromate and after exposure under a design the exposed area is removed with solutions of chlorites or hypochlorites, thereby providing ink-receptive areas in the region of the exposure, the remaining areas of the element being ink-repellent.

We have discovered that when hydrolyzed surface layers of cellulose ester sheets are sensitized with oxidants for cellulose it is not necessary to use solutions of strong oxidizing agents such as hypochlorite for the removal of the exposed hydrolyzed area of the layer; in fact, simple solutions of alkali such as sodium hydroxide effect a cleaner removal of exposed areas and accordingly produce cleaner differentiation between exposed and unexposed areas. In addition, the sensitive materials when processed in this manner have, in effect, a higher sensitivity to light as will be discussed hereinafter.

One object of our invention, therefore, is to provide a novel process of producing designs on lithographic printing plates, particularly lithographic cellulose ester printing plates. Another object is to provide a simple method of effecting clean differentiation between exposed and unexposed areas of hydrolyzed cellulose ester printing plates. Other objects will appear from the following description of our invention.

As has been indicated, the objects of our invention are accomplished by sensitizing a hydrolyzed cellulose ester surface with an agent such as bichromate which is capable of oxidizing hydrolyzed cellulose ester or cellulose, particularly in the presence of blue and ultraviolet light, and after exposing the sensitive surface under a design such as a line or halftone negative, removing the exposed area of the surface with a simple alkaline solution containing no oxidizing agents.

The accompanying drawings illustrate in enlarged cross-sectional view the appearance of a cellulose ester printing plate at various stages in our process.

In addition to water-soluble chromium salt sensitizers such as alkali metal and ammonium bichromates, we may use other oxidants for cellulose whose oxidizing effect is accelerated by exposure to light such as the uranyl salts, uranyl sulfate, uranyl nitrate, uranyl acetate, uranyl chloride, etc., especially the latter, and ferric salt oxidants such as ferric sulfate, nitrate, oxalate, acetate, and chloride, especially the latter. These salts have the unique property of oxidizing cellulose, slowly in the dark, and relatively fast in light, to products highly susceptible to alkaline solutions and when these are formed in the exposed region of a lithographic plate they are readily removable from underlying surfaces which are receptive to the usual oil-bodied printing inks.

Here and in the appended claims we refer to the exposed areas of the printing plate as being "alkali-susceptible" rather than "alkali soluble," and the areas being "removable" rather than "dissolved" with alkali, because it appears from the theory of the mechanism of the process that exposure of the sensitized hydrolyzed surface produces a weak link in the cellulose chain at which point degradation is started by alkali and propagated along the chain with the final result that the exposed areas are removable.

The materials we use for forming our printing plate are sheets or coatings of cellulose ester such as substantially fully esterified cellulose acetate having the maximum resistance to moisture and containing about 43.5% acetyl, although other esters of equivalent properties and acyl content such as cellulose propionate, acetate-propionate, etc., give useful results. The cellulose ester sheet is hydrolyzed on the surface to the predetermined depth always leaving a stratum unhydrolyzed. This may be accomplished by simply immersing the sheet for a few minutes in an aqueous alcohplic solution of caustic alkali followed by washing the sheet and neutralizing residual alkali with weak acid solution. If desired, only one surface may be hydrolyzed by applying the solution thereto by well known methods. Similarly, the cellulose ester sheet may consist of a composite sheet containing two or more layers of cellulose ester bonded together, one or both outer surfaces being hydrolyzed. We prefer to provide the element with an antihalation layer on the side opposite that to be exposed, at any time before exposure of the element, but in view of the destructive effect of the caustic alkali solution used in the hydrolysis step, it is advisable to apply the antihalation layer after hydrolysis or better still, to seal the antihalation layer within the cellulose ester sheet as described in the co-pending Nadeau et al., U. S. patent application Serial No. 75,444 filed concurrently herewith.

Our invention will now be described by reference to the following examples and the drawings which are illustrative only.

*Example 1*

A sheet of cellulose ester consisting originally of fully esterified cellulose acetate and which had previously been superficially hydrolyzed on both sides, was sensitized with an aqueous solution of ammonium bichromate. This can be accomplished by well known coating methods on a large scale, or conveniently and satisfactorily on a smaller scale by placing the edges of two sheets of the material in the nip between the rollers of a wringer with blotter sheets adjacent to the rollers to absorb excess bichromate solution, then placing a bead of the bichromate solution between the hydrolyzed cellulose ester sheets and quickly advancing the sheets between the wringer rolls. The sheets are then separated and the adjacent surfaces are found to be uniformly sensitized with the bichromate solution. One of these sensitized sheets was placed under a suitable negative and exposed until a light brown print-out image was visible, following which the exposed surface was rinsed to remove excess bichromate and lightly swabbed with an N/10 aqueous sodium hydroxide solution. The brown image soon disappeared and the hydrolyzed cellulose ester was gradually removed from the exposed area. Following neutralization of the excess alkali with acetic acid solution, it was found that the exposed areas of the sheet would receive greasy printing ink; whereas the unexposed areas consisting of hydrolyzed cellulose ester when moistened, repelled the ink. A similar result was obtained when exposed samples of the film were developed with N/100 sodium hydroxide solution or one per cent sodium carbonate solution.

*Example 2*

A laminated cellulose acetate film of the type disclosed in the Nadeau et al invention, having an antihalation layer sealed between two strata of cellulose acetate, was hydrolyzed on both sides with an aqueous alcoholic alkali solution and sensitized on one of the outer surfaces with bichromate solution. The resulting element is shown in enlarged cross-sectional view in the first stage of the accompanying drawings, wherein the cellulose acetate layers 10 and 11 enclose the yellow antihalation layer 14, the outer surface 13 of layer 10 consisting of hydrolyzed cellulose acetate and the corresponding hydrolyzed surface 12 of layer 11 being sensitized with bichromate. Exposure of surface 12 under a design using a carbon arc light source produced oxidized cellulose in exposed areas 14 of layer 12 as shown in the second stage of the drawings. The exposed surface of the element was then swabbed with a dilute solution of sodium hydroxide to remove the exposed areas 14 with the result shown in the third stage of the drawings according to which areas 15 of the cellulose acetate layer 11 are bared and thus selectively attract greasy printing inks when the element is moistened with water as usual in a lithographic press. When prints were made from this element it was found that they possessed excellent definition. If desirable, prior to inking the plate, the quality of the developed design can be more readily inspected if the plate is swabbed with a solvent solution of a cellulose acetate dye such as the following:

| | | |
|---|---|---|
| Acetate dye[1] | grams | 2 |
| Ethly cellosolve (2-ethoxy ethanol) | cc | 75 |
| Methyl ethyl ketone | cc | 5 |
| Acetic acid (100%) | grams | 25 |
| Ammonium nitrate | cc | 150 |

[1] E. g. dye of McNally et al. U. S. 2,251,947, granted August 12, 1941, particularly of Example 9 thereof.

In the above process, the alkali developing solution can be replaced by an alkaline oxidizing solution such as an alkaline peroxide solution, and in this case if the alkalinity is supplied by a material such as morpholine, acetate dyes may be dispersed in the solution with the result that the printing areas of the plate are dyed up at the same time as the exposed hydrolyzed cellulose acetate is being removed. However, as previously mentioned, we prefer a simple alkaline solution for development of the printing plate.

Plates processed in the manner of the above examples were found to print designs of very high definition and it was found that shorter exposure of the plates under a design were possible when utilizing plain alkali as the developing solution and when using oxidizing solutions such as disclosed in the Colt patent mentioned. Thus, as indicated, our process in effect provides a more sensitive printing plate. Other advantages of the process will occur to those skilled in the art.

*Example 3*

The hydrolyzed surface of elements of the type described in the above examples may first be treated with blue or ultraviolet light-absorbing materials such as yellow vat dyes or dye intermediates such as "R" salt and the surface thereafter sensitized with a solution of a cellulose oxidizing agent such as persulfate, periodate or hypochlorite. When using the latter it is desirable to keep the sensitive layer moistened with the hypochlorite solution during exposure under the design. After exposure under the design, such as a line or halftone negative, the exposed layer is developed with alkali solution as above to yield an ink-receptive design.

*Example 4*

If desired, the bichromate sensitizing solution used in the above examples can be replaced by the mentioned uranyl or ferric salts. A mixture of, for example, uranyl and ferric salts will impart greater sensitivity than would be expected from the behavior of the individual salts when used alone.

In the above examples development is preferably carried out with a solution of strong alkali, such as sodium hydroxide or sodium carbonate; however, other alkaline materials such as alkali metal phosphates and strong organic bases such as trimethyl benzyl ammonium hydroxide produce useful results.

Our invention may also be practiced by use of sensitive elements of the type having a support which possesses high dimensional stability. That is, the element shown in the first stage of the drawings may be adhered to a metal foil in a manner such that layer 13 is adjacent to the metal foil such as aluminum foil. The element is then exposed and processed as described in Example 2 to yield a lithographic printing plate. Similarly, very useful results are obtained by taking a single sheet or film of surface-hydrolyzed cellulose ester, such as cellulose triacetate, and providing the sheet with a suitable antihalation layer on one surface thereof or coating the antihalation layer on the metal plate and then laminating the sheet to the metal plate or aluminum foil as the case may be. Surface hydrolysis of the sheet may be carried out before or after lamination to the metal layer. Aluminum foil of the thickness of the order of .002-inch is suitable for this purpose. Similarly, the metal foil may be provided with a strengthening backing layer of, for example, paper, in which case the thickness of the foil may be of the order of .0005-inch and the paper backing about .01-inch thickness.

We also contemplate as a part of our invention, applying our process to forming a printing plate integral with a photographic film negative. That is, a sensitive film is provided having a cellulose ester support on one side of which is coated a silver halide emulsion layer and the opposite surface is hydrolyzed. After exposing the sensitive silver halide surface and developing a line or halftone image thereon, the hydrolyzed surface is sensitized and processed by any of the methods of the preceding examples, as by sensitizing with a bichromate solution, thereafter exposing the sensitive stratum through the negative image on the opposite surface and finally forming ink receptive and repellant areas in the stratum by development with alkaline solutions. The process provides a speedy method for preparing printing plates.

Our invention having been described, it is to be understood that the disclosure herein is by way of example and that we consider as included in our invention all modifications and equivalents falling within the scope of the appended claims.

What we claim is:

1. The method of forming a design on a cellulosic surface for printing purposes, which comprises sensitizing a hydrolyzed surface layer of a cellulose organic acid ester sheet with an oxidant for hydrolyzed cellulose ester whose oxidizing effect is accelerated by light selected from the blue and ultraviolet regions of the spectrum, exposing said sensitive layer under a design, thereby oxidizing and rendering the exposed area of said surface layer removable with alkaline solution, and selectively removing said exposed area with an alkaline solution free of oxidizing agents.

2. The method of forming a design on a cellulosic surface for printing purposes, which comprises sensitizing a hydrolyzed surface layer of a cellulose acetate sheet with an oxidant for hydrolyzed cellulose ester whose oxidizing effect is accelerated by light selected from the blue and ultraviolet regions of the spectrum, exposing said sensitive layer under a design thereby oxidizing and rendering the exposed area of said surface layer removable with alkaline solution, and selectively removing said exposed area with an alkaline solution free of oxidizing agents.

3. The method of forming a design on a cellulosic surface for printing purposes, which comprises sensitizing a hydrolyzed surface layer of a cellulose organic acid ester sheet with a water-soluble chromium salt oxidant for hydrolyzed cellulose ester whose oxidizing effect is accelerated by light selected from the blue and ultraviolet regions of the spectrum, exposing said sensitive layer under a design thereby oxidizing and rendering the exposed areas of said surface layer removable with alkaline solution, and selectively removing said exposed area with an alkaline solution free of oxidizing agents.

4. The method of forming a design on a cellulosic surface for printing purposes, which comprises bichromate sensitizing a hydrolyzed surface layer of a cellulose acetate sheet, exposing said sensitive layer under a design thereby oxidizing and rendering the exposed areas of said surface layer removable with alkaline solution, and selectively removing said exposed area with an alkaline solution free of oxidizing agents.

5. The method of forming a design on a cellulosic surface for printing purposes, which comprises sensitizing a hydrolyzed surface layer of a cellulose organic acid ester sheet with a water-soluble ferric salt oxidant for hydrolyzed cellulose ester whose oxidizing effect is accelerated by light selected from the blue and ultraviolet regions of the spectrum, exposing said sensitive layer under a design thereby oxidizing and rendering the exposed areas of said surface layer removable with alkaline solution, and selectively removing said exposed area with an alkaline solution free of oxidizing agents.

6. The method of forming a design on a cellulosic surface for printing purposes, which comprises sensitizing a hydrolyzed surface layer of a cellulose acetate sheet with a water-soluble ferric salt oxidant for hydrolyzed cellulose ester whose oxidizing effect is accelerated by light selected from the blue and ultraviolet regions of the spectrum, exposing said sensitive layer under a design thereby oxidizing and rendering the exposed areas of said surface layer removable with alkaline solution, and selectively removing said exposed area with an alkaline solution free of oxidizing agents.

7. The method of forming a design on a cellulosic surface for printing purposes, which comprises sensitizing a hydrolyzed surface layer of a cellulose acetate sheet with ferric chloride, exposing said sensitive layer under a design thereby oxidizing and rendering the exposed areas of said surface layer removable with alkaline solution, and selectively removing said exposed area with an alkaline solution free of oxidizing agents.

8. The method of forming a design on a cellulosic surface for printing purposes, which comprises sensitizing a hydrolyzed surface layer of a cellulose organic acid ester sheet with a water-soluble uranyl salt oxidant for hydrolyzed cellulose ester whose oxidizing effect is accelerated by light selected from the blue and ultraviolet regions of the spectrum, exposing said sensitive layer under a design thereby oxidizing and rendering the exposed areas of said surface layer removable with alkaline solution, and selectively removing said exposed area with an alkaline solution free of oxidizing agents.

9. The method of forming a design on a cellulosic surface for printing purposes, which comprises sensitizing a hydrolyzed surface layer of a cellulose acetate sheet with a water-soluble uranyl salt oxidant for hydrolyzed cellulose ester whose oxidizing effect is accelerated by light selected from the blue and ultraviolet regions of the spectrum, exposing said sensitive layer under a design thereby oxidizing and rendering the exposed areas of said surface layer removable with alkaline solution, and selectively removing said exposed area with an alkaline solution free of oxidizing agents.

10. The method of forming a design on a cellulosic surface for printing purposes, which comprises sensitizing a hydrolyzed surface layer of a cellulose acetate sheet with uranyl chloride, exposing said sensitive layer under a design thereby oxidizing and rendering the exposed areas of said surface layer removable with alkaline solution, and selectively removing said exposed area with an alkaline solution free of oxidizing agents.

WILLIAM O. KENYON.
CORNELIUS C. UNRUH.

REFERENCES CITED

The following references are of record in the file of this patent:

UNITED STATES PATENTS

| Number | Name | Date |
|---|---|---|
| 2,448,861 | Colt | Sept. 7, 1948 |

FOREIGN PATENTS

| Number | Country | Date |
|---|---|---|
| 565,752 | Great Britain | Nov. 27, 1944 |